US011735633B2

(12) United States Patent
Siemieniec et al.

(10) Patent No.: US 11,735,633 B2
(45) Date of Patent: Aug. 22, 2023

(54) SILICON CARBIDE DEVICE WITH TRENCH GATE STRUCTURE AND METHOD OF MANUFACTURING

(71) Applicant: Infineon Technologies AG, Neubiberg (DE)

(72) Inventors: Ralf Siemieniec, Villach (AT); Rudolf Elpelt, Erlangen (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 108 days.

(21) Appl. No.: 17/080,950

(22) Filed: Oct. 27, 2020

(65) Prior Publication Data

US 2021/0134960 A1 May 6, 2021

(30) Foreign Application Priority Data

Oct. 31, 2019 (DE) .......................... 102019129412.6

(51) Int. Cl.
*H01L 29/16* (2006.01)
*H01L 29/04* (2006.01)
(Continued)

(52) U.S. Cl.
CPC ........ *H01L 29/1608* (2013.01); *H01L 29/045* (2013.01); *H01L 29/66068* (2013.01); *H01L 29/7813* (2013.01)

(58) Field of Classification Search
CPC ............... H01L 29/1608; H01L 29/045; H01L 29/66068; H01L 29/7813; H01L 29/0696;
(Continued)

(56) References Cited

U.S. PATENT DOCUMENTS 6,133,587 A * 10/2000 Takeuchi ............ H01L 29/7838
257/77
9,293,558 B2 3/2016 Siemieniec et al.
(Continued)

FOREIGN PATENT DOCUMENTS

DE 102014119465 B3 5/2016
DE 102018104581 A1 9/2018
(Continued)

OTHER PUBLICATIONS

Foster, Derrick W., et al., "An In-Situ Phosphorus Doped Polysilicon Deposition Process Optimized for Production", V-MIC Conference, Jun. 9-10, 1986, IEEE, Jun. 9, 1986, pp. 523-529.
(Continued)

*Primary Examiner* — Cuong B Nguyen
(74) *Attorney, Agent, or Firm* — Murphy, Bilak & Homiller, PLLC

(57) ABSTRACT

A silicon carbide device includes a silicon carbide body having a hexagonal crystal lattice with a c-plane and with further main planes. The further main planes include a-planes and m-planes. A mean surface plane of the silicon carbide body is tilted to the c-plane by an off-axis angle. The silicon carbide body includes a columnar portion with column sidewalls. At least three of the column sidewalls are oriented along a respective one of the further main planes. A trench gate structure is in contact with the at least three of the column sidewalls.

18 Claims, 11 Drawing Sheets

(51) Int. Cl.
*H01L 29/66* (2006.01)
*H01L 29/78* (2006.01)

(58) Field of Classification Search
CPC . H01L 29/0878; H01L 29/20; H01L 29/2003; H01L 29/0688; H01L 29/1095; H01L 29/41766; H01L 29/66727; H01L 29/66734
See application file for complete search history.

(56) References Cited

U.S. PATENT DOCUMENTS

| | | | |
|---|---|---|---|
| 9,478,655 B2 | 10/2016 | Siemieniec et al. | |
| 9,741,712 B2 * | 8/2017 | Rupp | H01L 29/045 |
| 2011/0121316 A1 | 5/2011 | Harada | |
| 2013/0285069 A1 | 10/2013 | Yano et al. | |
| 2017/0345905 A1 | 11/2017 | Siemieniec et al. | |
| 2019/0189736 A1 | 6/2019 | Kyogoku et al. | |

FOREIGN PATENT DOCUMENTS

| | | |
|---|---|---|
| DE | 102017128633 A1 | 6/2019 |
| JP | 6105032 B2 | 3/2017 |

OTHER PUBLICATIONS

Nakamura, T., et al., "High Performance SiC Trench Devices with Ultra-low Ron", 2011 International Electron Devices Meeting, Dec. 2011, Dec. 5, 2011, pp. 599-601.

Tanaka, Rina, et al., "Impact of Grounding the Bottom Oxide Protection Layer on the Short-Circuit Ruggedness of 4H-SiC Trench MOSFETs", Proceedings of the 26th International Symposium on Power Semiconductor Devices & IC's, Jun. 15-19, 2014 Waikoloa, Hawaii, Jun. 15, 2014, pp. 75-78.

* cited by examiner

SILICON CARBIDE DEVICE WITH TRENCH GATE STRUCTURE AND METHOD OF MANUFACTURING

TECHNICAL FIELD

Examples of the present disclosure relate to a silicon carbide device, in particular to a silicon carbide device with trench gate structure and to a method of manufacturing a silicon carbide device with trench gate structure.

BACKGROUND

Semiconductor components based on silicon carbide (SiC) benefit from the high band gap and the high breakdown strength of silicon carbide (SiC). However, interfaces between a silicon carbide body and a dielectric layer include a high number of interface states, which may be occupied or not occupied by charge carriers. Along the gate dielectric of a SiC MOSFET (SiC metal oxide semiconductor field effect transistor), the interface states may be occupied by more or fewer charge carriers depending on the operating state of the SiC MOSFET. The numbers of charge carriers that occupy the interface states influence the mobility and the concentration of free charge carriers that form the field-controlled transistor channel in the on state of the SiC MOSFET. Moreover, the high breakdown strength of SiC is usually not fully utilized since the field strength occurring in the gate dielectric and the reliability of the gate dielectric often limit the dielectric strength of the SiC MOSFET.

The present application is directed to a silicon carbide device that can utilize the intrinsic electric breakdown field strength of silicon carbide to a high degree.

SUMMARY

An embodiment of the present disclosure relates to a silicon carbide device. The silicon carbide device includes a silicon carbide body with a hexagonal crystal lattice with a c-plane and with further main planes. The further main planes include a-planes and m-planes. A mean surface plane of the silicon carbide body is tilted to the c-plane by an off-axis angle. The silicon carbide body includes a columnar portion with column sidewalls. At least three of the column sidewalls are oriented along a respective one of the further main planes. A trench gate structure is in contact with the at least three column sidewalls.

A further embodiment of the present disclosure relates to a method of manufacturing a silicon carbide device. A silicon carbide body with a hexagonal crystal lattice with a c-plane and further main planes is provided. The further main planes comprise a-planes and m-planes. A mean surface plane of the silicon carbide body is tilted to the c-plane by an off-axis angle. A trench is formed that extends from a first surface into the silicon carbide body. The trench laterally exposes column sidewalls of a columnar portion of the silicon carbide body. At least three of the column sidewalls are oriented along the further main planes. A trench gate structure is formed in the trench, wherein the gate structure is in contact with the at least three column sidewalls.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and a method of manufacturing a silicon carbide device and together with the description serve to explain principles of the embodiments. Further embodiments are described in the following detailed description and the claims.

DETAILED DESCRIPTION

Figure 1A:
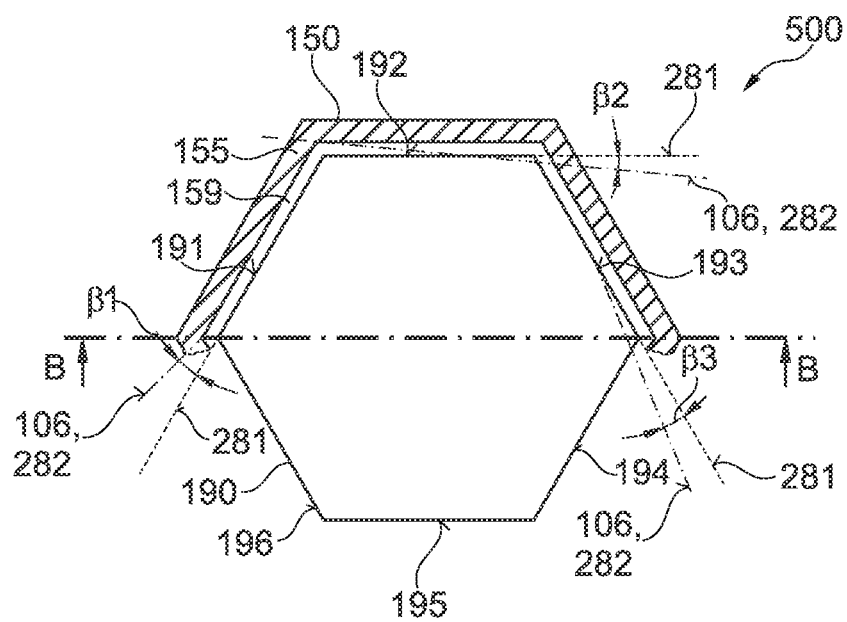
FIGS. 1A-1B show simplified horizontal and vertical cross-sectional views of a portion of a silicon carbide device with hexagonal columnar portion according to an embodiment.

In the following detailed description, reference is made to the accompanying drawings, which form a part hereof and in which are shown by way of illustrations specific embodiments in which a silicon carbide device and a method of manufacturing a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An "ohmic contact" is a non-rectifying electrical junction with a linear or almost linear current-voltage characteristic.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

The term "on" is not to be construed as meaning "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

The term "power semiconductor device" refers to semiconductor devices with high voltage blocking capability of at least 30 V, for example 100 V, 600 V, 1.6 kV, 3.3 kV or more and with a nominal on-state current or forward current of at least 1 A, for example 10 A or more.

A safe operating area (SOA) defines voltage and current conditions over which a semiconductor device can be expected to operate without self-damage. The SOA is given by published maximum values for device parameters like maximum continuous load current, maximum gate voltage and others.

According to an embodiment, a silicon carbide device may include a silicon carbide body which has a hexagonal crystal lattice with a c-plane and further main planes. The further main planes may include a-planes or m-planes.

The material of the silicon carbide body may be crystalline silicon carbide of any hexagonal polytype, e.g., 2H—SiC, 4H—SiC or 6H—SiC, by way of example. In addition to the main constituents silicon and carbon, the silicon carbide body may include dopant atoms, for example nitrogen N, phosphorus P, beryllium Be, boron B, aluminum Al, and/or gallium Ga. The silicon carbide body may include further impurities, for example hydrogen, fluorine and/or oxygen. The silicon carbide body may include or consist of a silicon carbide layer grown by epitaxy.

The silicon carbide body may have two essentially parallel main surfaces of the same shape and size and a lateral surface area connecting the edges of the two main surfaces. For example, the silicon carbide body may have the shape of a polygonal (e.g., rectangular or hexagonal) prism with or without rounded edges, a right cylinder or a slightly oblique cylinder, wherein some of the sides may lean at an angle of at most 8°, at most 5° or at most 3°.

A first surface at a front side of the silicon carbide body may be planar or ribbed. A mean surface plane of the first surface extends along the lateral directions. The mean surface plane of a planar first surface is identical with the planar first surface. The mean surface plane of a ribbed first surface is defined by the planar least squares plane of the ribbed first surface. Position and orientation of the planar least squares plane are defined such that the sum of the squares of the deviations of surface points of the ribbed first surface from the planar least squares plane has a minimum.

The silicon carbide body may laterally extend along a plane spanned by the lateral directions. Accordingly, the silicon carbide body may have a surface extension along two lateral directions and may have a thickness along a vertical direction perpendicular to the lateral directions. In other words, the vertical direction is parallel to a surface normal onto the mean surface plane.

The c-plane is a {0001} lattice plane. The further main planes may include a-planes ({11-20} family of lattice planes) and m-planes ({1-100} family of lattice planes). The a-planes include the six differently oriented lattice planes (11-20), (1-210), (−2110), (−1-120), (−12-10), and (2-1-10). The en-planes include the six differently oriented lattice planes (1-100), (10-10), (01-10), (−1100), (−1010), and (0-110).

The mean surface plane of the silicon carbide body may be tilted to the c-plane by an off-axis angle. In other words, the c-axis may be tilted to the vertical direction by the off-axis angle. The off-axis angle may be in a range from 2 degrees to 8 degrees, for example in a range from 3 degrees to degrees. In particular, the off-axis angle may be approximately 4 degrees. For example, the c-axis may be tilted such that a plane spanned by the vertical direction and the c-axis is parallel to the <11-20> direction. According to another example, the c-axis may be tilted such that a plane spanned by the vertical direction and the c-axis is parallel to the <1-100> direction. At the back side of the silicon carbide body, a second surface of the silicon carbide body may extend parallel or approximately parallel to the mean surface plane at the front side.

The silicon carbide body may include a columnar portion with column sidewalls. The number of the column sidewalls may be four, five or six, by way of example. In some examples, the shape of the columnar portion may be or may approximate a prism (e.g., a right prism, an oblique prism, or even a truncated prism), for example with a polygonal base area, typically in the shape of a regular polygon, with four, five or six sides. Neighboring column sidewalls may be connected via joining edges.

The joining edges may run parallel to each other. Alternatively, at least one of the joining edges may have another tilt angle to the vertical direction than at least one other joining edge. For example, a first joining edge may be tilted to the vertical direction by a first vertical tilt angle. A second joining edge may be tilted to the vertical direction by a second vertical tilt angle. A maximum angular difference between the first vertical tilt angle and the second vertical tilt angle may be equal to or smaller than the off-axis angle. At least three of the column sidewalls may be oriented along a respective one of the further main planes. In other words, at least three of the column sidewalls may be completely formed in further main planes of the crystal lattice or in planes only slightly laterally and/or slightly vertically tilted to further main planes of the crystal lattice. The term "slightly tilted" includes angular deviations from a respective main plane in the range of less than 5 degrees in any spatial direction.

For example, three, four, five or six column sidewalls are oriented in or along a plane of the {11-20} family of lattice planes, wherein each column sidewall is oriented in or along a different one of the planes of the {11-20} family of lattice planes. According to another example, three, four, five or six column sidewalls are oriented in or along a plane of the {1-100} family of lattice planes, wherein each column sidewall is oriented in or along a different one of the planes of the {1-100} family of lattice planes. According to yet another example, one or more of the column sidewalls may be oriented to a plane of the {11-20} family of lattice planes and at least one further column sidewall may be oriented in or along one of the planes of the {1-100} family of lattice planes.

A gate structure may be in contact with the at least three column sidewalls. The gate structure may include a conductive gate electrode and a gate dielectric. The gate dielectric may be formed between the at least three column sidewalls and the gate electrode. For example, the gate dielectric may separate the at least three column sidewalls and the gate electrode.

The gate structure may include one or more further conductive structures in addition to the gate electrode. The further conductive structures may be electrically decoupled from the gate electrode by at least one pn junction, by a high-resistive ohmic connection and/or by a dielectric insulation, by way of example. The gate structure may include one or more further dielectric structures that differ from the gate dielectric as regards thickness, composition and/or density.

By applying a suitable potential to the gate electrode, inversion layers or accumulation layers may be formed in the columnar portion along the at least three sidewalls. The inversion layers or the accumulation layers may form gated channels of transistor cells. Column sidewalls at which gated channels are formed in an operational mode of the silicon carbide device form active column sidewalls. Forming gated channels that extend along at least three active column sidewalls as described above may facilitate increasing the total gated channel width per area unit of the silicon carbide body. A larger total channel width may contribute to decreasing an on-state resistance of silicon carbide devices that use gated channels.

According to an embodiment, an absolute value of an in-plane tilt angle between each column sidewall and the further main plane along which the column sidewall is oriented, is in a range from 0 degrees to 2 degrees. The in-plane tilt angles may be measured in the c-plane. For example, for each of the at least three column sidewalls, the c-plane and the column sidewall may form a respective first intersection line. The c-plane and the main plane that is oriented to the column sidewall form a respective second intersection line. For each of the at least three column sidewalls, an in-plane tilt angle between the first intersection line and the second intersection line is in a range from 0 degrees to 2 degrees.

With in-plane tilt angles of at most 2 degrees for each of the at least three column sidewalls, charge carrier mobility along all active column sidewalls may be sufficiently high and uniform for highly uniform threshold voltages along each of the active column sidewalls and for highly uniformly distributed on-state current in the silicon carbide body. Columnar portions with in-plane tilt angles of the column sidewalls of at most 2 degrees may be formed at reasonable effort.

According to an embodiment, for each of the at least three column sidewalls (191, . . . , 196), an absolute value of a vertical tilt angle between the column sidewall and the further main plane that is oriented to the column sidewall is in a range from 0 degrees to the off-axis angle α.

For example, a directed ion beam etching process with a beam axis parallel to the c-axis (<0001> lattice direction) may define the column sidewalls. In this case, absolute values of the vertical tilt angles may be equal to 0 or may be at most 1 degree.

According to another example, a directed ion beam etching process may pre-define the column sidewalls. A beam axis of the ion beam may run parallel to the vertical direction. A heat treatment in an atmosphere containing hydrogen may re-arrange silicon and carbon atoms of the column sidewalls. The re-arrangement may align the column sidewalls closer to the main plane to which the respective column sidewall is oriented.

In the case a plane spanned by the c-axis and the vertical direction runs perpendicular to a main plane to which one of the column sidewalls is oriented, the absolute value of one of the vertical tilt angles may be equal to the off-axis angle or smaller and the absolute value of one or two other vertical tilt angles may be half the off-axis angle or smaller.

In the case the plane spanned by the c-axis and the vertical direction forms the bisecting plane of the angle between two main planes, along which two neighboring active column sidewalls are oriented, the absolute value of four of the vertical tilt angles $\gamma_1, \ldots, \gamma_{nmax}$ may be equal to the half off-axis angle or smaller.

With vertical tilt angles not greater than the off-axis angle for each of the at least three columns sidewalls, charge carrier mobility along all active column sidewalls may facilitate highly uniform threshold voltages at the different active column sidewalls. Columnar portions with vertical tilt angles between the column sidewall and the respective main plane of at most the off-axis angle may be formed at reasonable effort. For example, forming the columnar portions may include a vertical, non-tilted etch process.

According to an embodiment, the absolute values of the vertical tilt angles may be in a range from 0 degrees to half of the off-axis angle. With vertical tilt angles not greater than half the off-axis angle for each of the at least three columns sidewalls, charge carrier mobility along all pertinent column sidewalls may be further increased and threshold voltage uniformity may be further improved. Columnar portions with vertical tilt angles between the column sidewall and the respective further main plane of at most half of the off-axis angle may be formed at reasonable effort by using a vertical, non-tilted etch process.

According to an embodiment, the at least three column sidewalls may neighbor each other. Each of the at least three column sidewalls is connected to at least one neighboring one of the three column sidewalls via a joining edge. Directly neighboring active column sidewalls may facilitate a highly area-efficient transistor cell layout with a comparatively large transistor channel width per unit area.

According to an embodiment, at least four of the column sidewalls are oriented along a respective one of the further main planes. The gate structure may be in contact with the at least four column sidewalls. The absolute values of in-plane tilt angles between each column sidewall and that further main plane, along which the column sidewall is oriented, may be in a range from 0 degrees to 2 degrees. The absolute values of vertical tilt angles between each of the at least three column sidewalls and that further main plane, which is oriented to the respective column sidewall, are in a range from 0 degrees to the off-axis angle or to the half off-axis angle. The at least four column sidewalls may neighbor each other.

For example, four of the column sidewalls are oriented along a respective one of the further main planes. According to a further example, five of the column sidewalls are oriented along a respective one of the further main planes. According to a further example, each of six column sidewalls is oriented along a respective one of the further main planes. With an increasing portion of column sidewalls oriented to a respective one of the further main planes, area efficiency of the silicon carbide device may be further increased.

According to an embodiment a cross-section of the columnar portion in a c-plane may form a hexagon. The hexagon may have sharp-angled edges, beveled edges and/or rounded edges. The hexagon may be a regular hexagon with approximately uniform edge length. Columnar portions with hexagonal cross-section, e.g., regular hexagonal cross-section, may facilitate high area efficiency.

According to an embodiment, the gate structure may form a grid that laterally separates neighboring columnar portions. For example, the silicon carbide device may include a plurality of columnar portions. The columnar portions may be laterally arranged in lines and rows. The gate structure may form a grid with one single of the columnar portions formed in each mesh of the grid. A grid-shaped gate structure may be combined, e.g., with columnar portions with a hexagonal, i.e. a regular hexagonal cross-section. The grid-shaped gate structure may contribute to high area efficiency and short switching times of the silicon carbide device.

According to an embodiment, the columnar portion may include a source region of a first conductivity type and a body region of a second conductivity type. The source region may be formed between the first surface of the silicon carbide body and the body region. The source region may be in contact with the at least three or the at least four column sidewalls. For example, the source region may be in contact with four, five or with each of six column sidewalls.

The source region may include a plurality of laterally separated source portions. Alternatively, each columnar portion includes one contiguous source region that is in direct contact with each of the at least three column sidewalls that are oriented to one of the further main planes.

The body region may be in contact with the at least three or the at least four column sidewalls. For example, the body region may be in contact with each column sidewall that is in contact with the source region. For example, the body region may be in contact with four, five or with each of six column sidewalls.

The source region and the body region may form part of an area-efficient transistor cell for silicon carbide devices, which are based on a hexagonal crystal lattice.

According to an embodiment, the silicon carbide body may include a voltage sustaining layer. The columnar portion may be formed between the first surface and the voltage sustaining layer.

The voltage sustaining layer may include or may consist of doped silicon carbide material and may be primarily designed to withstand and accommodate the nominal blocking voltage of a power semiconductor device.

The voltage sustaining layer may include a sufficiently lightly doped drift zone extending laterally through the silicon carbide body. Apart from a portion of the silicon carbide body along the outer edge of the silicon carbide body, the drift zone may have a mainly uniform dopant distribution along the lateral direction. Along the vertical direction, the dopant distribution may be approximately uniform.

Alternatively, a dopant concentration in the drift zone may slightly decrease or increase with decreasing distance to the first surface at the front side. A mean net dopant concentration in the silicon carbide body may be in the range from $1E15$ cm$^{-3}$ to $5E16$ cm$^{-3}$.

Alternatively or in addition, the voltage sustaining layer may include a superjunction structure that includes a repetitive structure of laterally arranged n doped columns and p doped columns.

For example, the superjunction structure may include stripe-shaped p doped columns and stripe-shaped n doped columns with a lateral longitudinal extension along a first lateral direction and alternatingly arranged along a lateral direction orthogonal to the first lateral direction. Neighboring p doped columns and n doped columns form pn junctions, respectively. Two neighboring columns form a unit cell of the superjunction structure. In the unit cell, the charge in the p-doped column and the charge in the n-doped column may at least partly (in some examples fully) compensate each other when the unit cell is depleted or partly depleted. More precisely, along a lateral line through the unit cell, the integral across the doping density of the p type dopants is in a range from $-20\%$ to $+20\%$, e.g. from $-10\%$ to $+10\%$ or from $-5\%$ to $+5\%$ of the integral across the doping density of the n type dopants. The superjunction structure is completely depleted at least at the nominal device breakthrough voltage or at a lower blocking voltage.

According to another example, the superjunction structure may include doped columns of a first conductivity type and one grid-shaped column of a second conductivity type, wherein the grid-shaped column laterally separates the doped columns. The doped columns may be arranged regularly, e.g., at regular center-to-center distances. The center-to-center distance between neighboring doped columns may be equal to or at least approximately equal to the center-to-center distance between neighboring columnar portions. The grid-shaped column may include a plurality of equal-sized ring portions that laterally directly adjoin to each other. Each ring portion laterally surrounds one doped column at uniform width. One doped column and the ring portion surrounding the doped column form a unit cell of the superjunction structure. In the unit cell, the charge in the p-doped column and the charge in the n-doped column partly or fully compensate each other when the unit cell is depleted or partly depleted. More precisely, across a horizontal plane of the unit cell, the surface integral of the doping density of the p type dopants is in a range from $-20\%$ to $+20\%$, e.g. from $-10\%$ to $+10\%$ or from $-5\%$ to $+5\%$ of the integral of the doping density of the n type dopants. The voltage sustaining layer forms part of an intrinsic electric resistance in the on-state of the silicon carbide device, i.e., in the state with a load current flowing along the active column sidewalls. In particular in combination with comparatively low-resistive voltage sustaining layers, e.g., voltage sustaining layers including a superjunction structure or including a comparatively thin drift zone, transistor cells based on three or more active column sidewalls may significantly contribute to a low on-state resistance.

According to an embodiment, a deep shielding region of the second conductivity type may extend from a side oriented to the body region into the voltage sustaining layer. The deep shielding region may be at a lateral distance to the gate structure. In other words, the deep shielding region may be laterally separated from the gate structure. A distance between the first surface and a local dopant maximum in the deep shielding region may be greater than a vertical extension of the gate structure. In other words, the deep shielding region may extend deeper into the silicon carbide body than the gate structure. A portion of the deep shielding region may be formed between the gate structure and the second surface of the silicon carbide body.

The deep shielding region may be formed in and/or below a central section of the columnar portion. The central section includes a lateral center of the columnar portion and the section directly around the lateral center. The deep shielding region may be rotational symmetric, e.g. point-symmetric, with respect to a longitudinal axis through the lateral center of the columnar portion. The longitudinal axis of the deep shielding region may connect the lateral centers of the deep shielding region at different distances to the first surface. For example, the longitudinal axis may be vertical or may be parallel to the <0001> lattice direction. The deep shielding region may contribute to shielding the gate structure against an electric potential that may be applied at the back side of the silicon carbide body. In a blocking mode of the silicon carbide device, the deep shielding region may reduce the electric field in the gate dielectric and may thus contribute to increasing device reliability.

According to an embodiment, a shielding connection region of the second conductivity type may extend from the first surface to the deep shielding region. The shielding connection region may be at a lateral distance to the gate structure. In other words, the shielding connection region may be laterally separated from the gate structure.

The shielding connection region may be formed in the central section of the columnar portion. The shielding connection region may be rotational symmetric, e.g. point-symmetric, with respect to a longitudinal axis through the lateral center of the shielding connection region. The longitudinal axis of the shielding connection region may connect the lateral centers of the shielding connection region at different distances to the first surface.

The shielding connection region may form a low-resistive ohmic path between the deep shielding portion and a conductive structure formed on the first surface. The low-resistive ohmic connection may effectively dissipate an avalanche current. The shielding connection region may be formed at low additional effort by masked ion implantation. Formation of the shielding connection region and formation of the deep shielding region may be effectively combined. For example, forming the shielding connection region and forming the deep shielding region may basically use the same implant mask. The implant mask may be modified between the implant(s) for the deep shielding region and the implant(s) for the shielding connection region or may remain unmodified between the implant(s) for the deep shielding region and the implant(s) for the shielding connection region.

According to a further embodiment, a groove contact structure may extend from the first surface to or into the deep shielding region. The groove contact structure may be at a lateral distance to the gate structure. In other words, the groove contact structure may be laterally separated from the gate structure. A minimum distance between the gate structure and the groove contact structure may be smaller than a vertical extension of the groove contact structure. A vertical extension of the groove contact structure may be equal to or greater than a vertical extension of the gate structure.

The groove contact structure may be formed in the central section of the columnar portion. The groove contact structure may be rotational symmetric, e.g. point-symmetric, with respect to a vertical axis through a lateral center of the groove contact structure. The groove contact structure includes conductive material. The conductive material of the groove contact structure may include one, two or more different, conductive materials. For example, the groove contact structure may include heavily doped polycrystalline silicon, one metal or metal compound, at least two metals and/or metal compounds, or heavily doped polycrystalline silicon in combination with at least one metal or metal compound.

The groove contact structure may form a low-resistive ohmic path between the deep shielding portion and a conductive structure formed on the first surface. The conductivity of the conductive material in the groove contact structure may be higher than that of doped silicon carbide, e.g., p doped silicon carbide. The low-resistive ohmic connection may dissipate an avalanche current in a highly effective way. The groove contact structure may be formed at low additional effort, e.g., by using a combined etch mask defining both the gate structure and the groove contact structure. Alternatively or in addition, forming the groove contact structure and forming the gate structure may use a combined deposition process for a material used for both the conductive gate electrode and the groove contact structure.

According to an embodiment, the body region may include a heavily doped body contact region. The body contact region may be in contact with the groove contact structure. The body contact region may have a sufficiently high dopant concentration such that the body contact region and the groove contact structure form a low-resistive ohmic contact. The body contact region may contribute to reducing the risk of latch-up effects.

According to an embodiment, the voltage sustaining layer and the groove contact structure may form a Schottky contact. The Schottky contact may be located between the body region and the deep shielding region. The Schottky contact may have a lower set-in voltage than the intrinsic body diode formed by the pn junction between the deep shielding region and the voltage sustaining layer. The Schottky contact may contribute to reducing or avoiding bipolar current flow through the silicon carbide body under reverse bias and under operation conditions within the SOA. Reducing bipolar current reduces an eventual bipolar degradation of the semiconductor device.

According to a further embodiment, a method of manufacturing a silicon carbide device may include providing a silicon carbide body with a hexagonal crystal lattice with a c-plane and further main planes. The further main planes may include a-planes and m-planes. A mean surface plane of the silicon carbide body may be tilted to the c-plane by an off-axis angle.

A trench may be formed. The trench extends from a first surface into the silicon carbide body. The trench may laterally expose column sidewalls of a columnar portion of the silicon carbide body. At least three of the column sidewalls may be oriented along one of the further main planes, respectively. A trench gate structure is formed in the trench. The trench gate structure may be in contact with the at least three column sidewalls. The trench gate structure may form a grid. The trench gate structure may include a plurality of laterally interconnected trench gate portions. Each trench gate portion may be in contact with one column sidewall of a first column portion at a first side and with one column sidewall of a second column portion at a second side, wherein the second side is opposite to the first side.

According to an embodiment, forming the trench may include a directed etch process with an axis of an etch beam oriented parallel to the <0001> lattice direction. For example, forming the trench may include a ribbon ion beam etch process. The ribbon ion beam etch process facilitates etching that may directly expose the further main planes at comparatively high preciseness and low angle deviations between the column sidewalls and that further main planes to which the column sidewalls are oriented to.

According to another embodiment, forming the trench may include a directed etch process with an axis of an etch beam oriented vertical to the mean surface plane. After etching, a heat treatment in an atmosphere containing hydrogen gas may be performed. The heat treatment may regroup silicon and carbon atoms along the surfaces exposed by the directed etch process. The regrouping may result in a better alignment of each column sidewall to that further main plane to which the respective column sidewall is oriented.

Figure 1B:
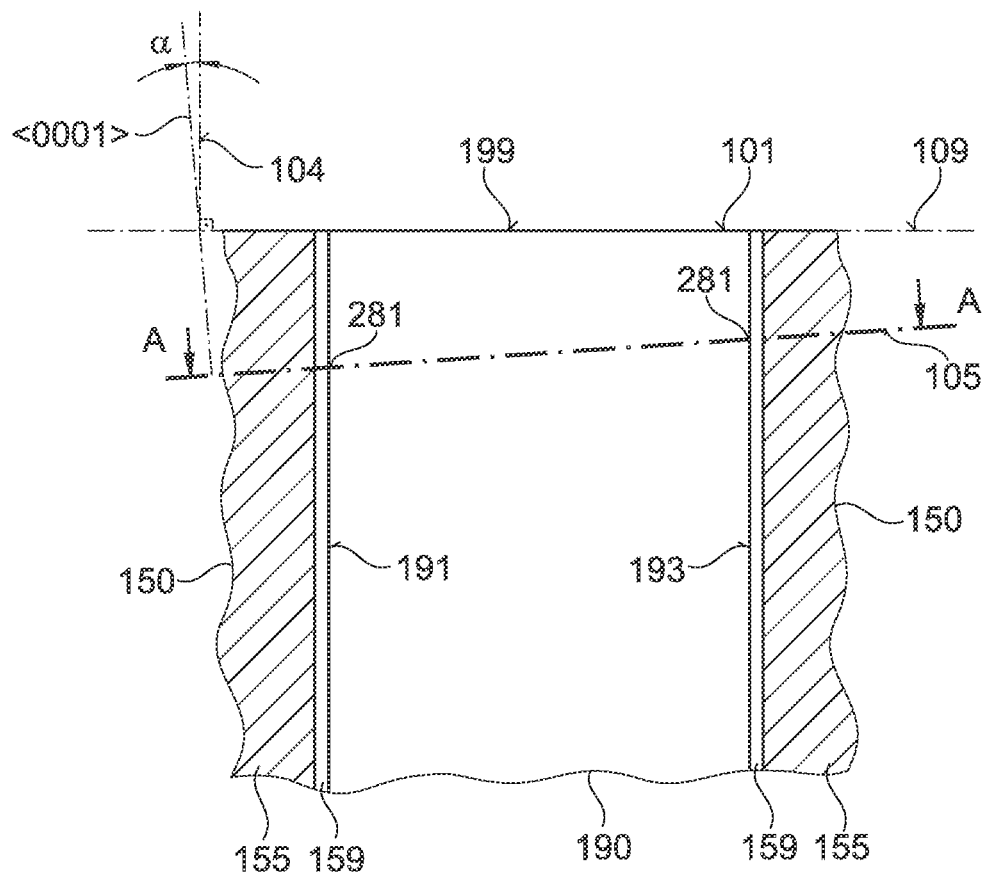

FIGS. 1A and 1B refer to a silicon carbide device 500 with a silicon carbide body. The silicon carbide body has a hexagonal crystal lattice with a c-plane 105 and further main planes 106. The c-plane is a {0001} lattice plane. The further main planes 106 may be a-planes and m-planes.

A portion of a first surface 101 of the silicon carbide body at the front side of the silicon carbide device 500 forms a top surface 199 of the columnar portion 190. The top surface 199 may be planar or ribbed. A mean surface plane 109 of the first surface 101 extends along lateral directions. For simplicity, FIG. 1B and all following FIGS. refer to a planar first surface 101 and a mean surface plane 109 that is coplanar with the first surface 101. A vertical direction 104 is orthogonal to the lateral directions and orthogonal to the mean surface plane 109.

The top surface 199 of the columnar portion 190 is tilted to the c-plane 105 by an off-axis angle α. Accordingly, the c-axis (<0001> lattice direction) is tilted to the vertical direction 104 by the off-axis angle α.

A lateral (also: horizontal) cross-section of the columnar portion 190 or a cross-section of the columnar portion 190 parallel to the c-plane 105 may form a hexagon, e.g. a regular hexagon. The hexagon may have sharp-angled, beveled, and/or rounded edges.

The columnar portion 190 has six column sidewalls 191, . . . , 196. Each column sidewall 191, . . . , 196 is oriented along another lattice plane of the same family of lattice planes. For example, each column sidewall 191, . . . , 196 is oriented along another lattice plane of the {11-20} family of lattice planes (a-planes). In other words: A first one of the column sidewalls 191, . . . , 196 is oriented along a (11-20) lattice plane, a second one of the column sidewalls 191, . . . , 196 is oriented along a (1-210) lattice plane, a third one of the column sidewalls 191, . . . , 196 is oriented along a (-2110) lattice plane, a fourth one of the column sidewalls 191, . . . , 196 is oriented along a (-1-120) lattice plane, a fifth one of the column sidewalls 191, . . . , 196 is oriented along a (-12-10) lattice plane, and a sixth one of the column sidewalls 191, . . . , 196 is oriented along a (2-1-10) lattice plane.

Each of the column sidewalls 191, . . . , 196 may be fully aligned to the respective lattice plane or may be slightly laterally and/or vertically tilted to the respective lattice plane.

FIG. 1A shows in-plane tilt angles β1, β2, β3 between three column sidewalls 191, 192, 193 and that {11-20} lattice plane, to which the respective column sidewall is oriented. The in-plane tilt angles indicate a possible lateral tilt between the column sidewalls 191, . . . , 196 and the respective {11-20} lattice plane. The in-plane tilt angles are measured in the c-plane 105. The c-plane 105 and each column sidewall 191, . . . , 196 form first intersection lines 281 shown in FIGS. 1A and 1B. The c-plane 105 and the lattice planes 106 of the {11-20} family of lattice planes form second intersection lines 282. For each column sidewall 191, . . . , 196, the in-plane tilt angle is in a range from 0 degrees to 2 degrees. The six in-plane tilt angles of the columnar portion 190 may be equal or may differ from each other.

A gate structure 150 is in contact with the six column sidewalls 191, . . . , 196. The gate structure 150 includes a conductive gate electrode 155 and a gate dielectric 159. The gate dielectric 159 is formed between the gate electrode 155 and the six column sidewalls 191, . . . , 196.

FIG. 2 to FIG. 5 refer to the vertical alignment of the column sidewalls 191, . . . , 196 to the lattice planes 106 of a family of lattice planes.

Figure 2:
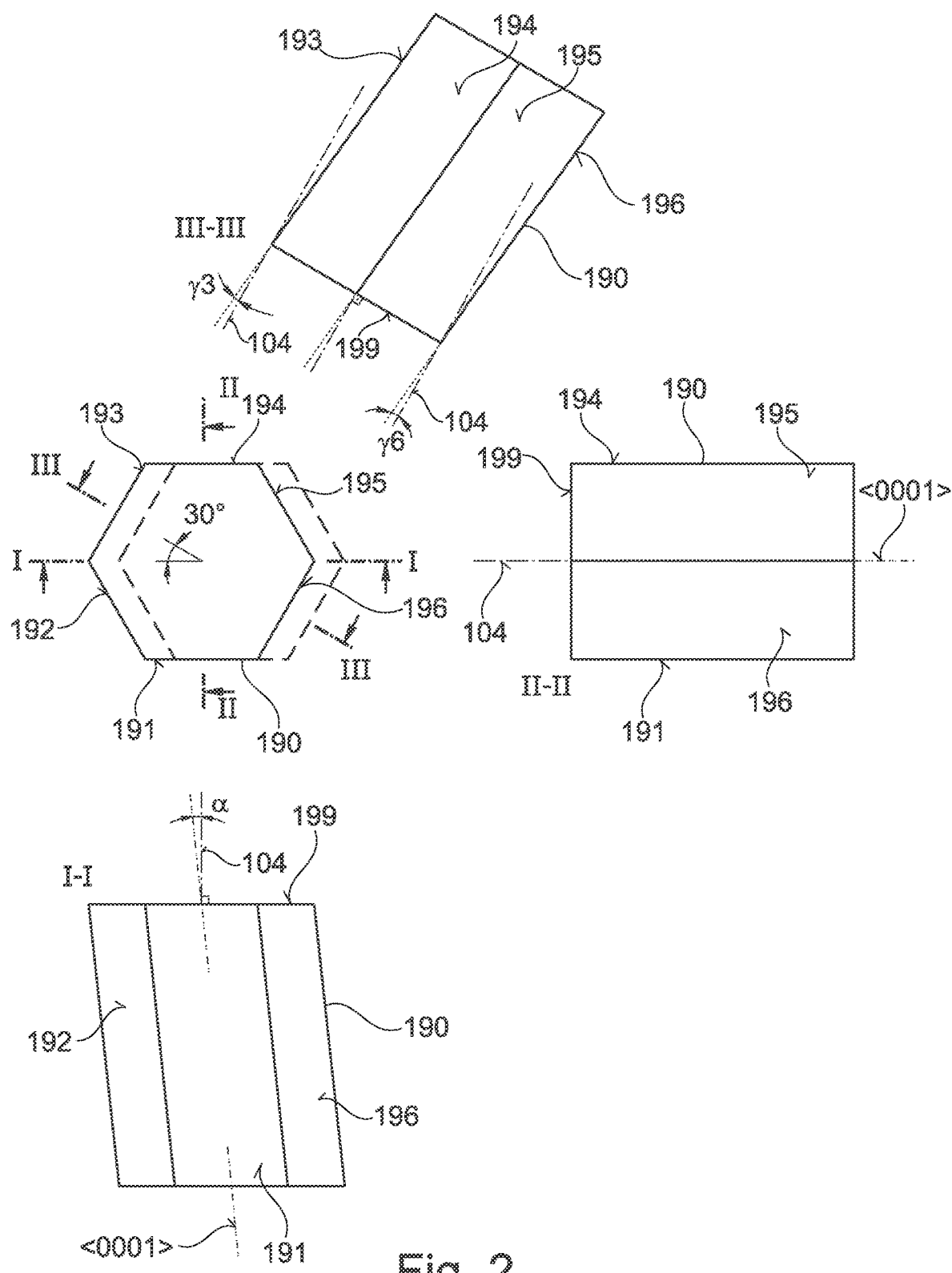
FIGS. 2-5 show simplified top and side views of differently oriented columnar portions of a silicon carbide device according to further embodiments.
Figure 3:
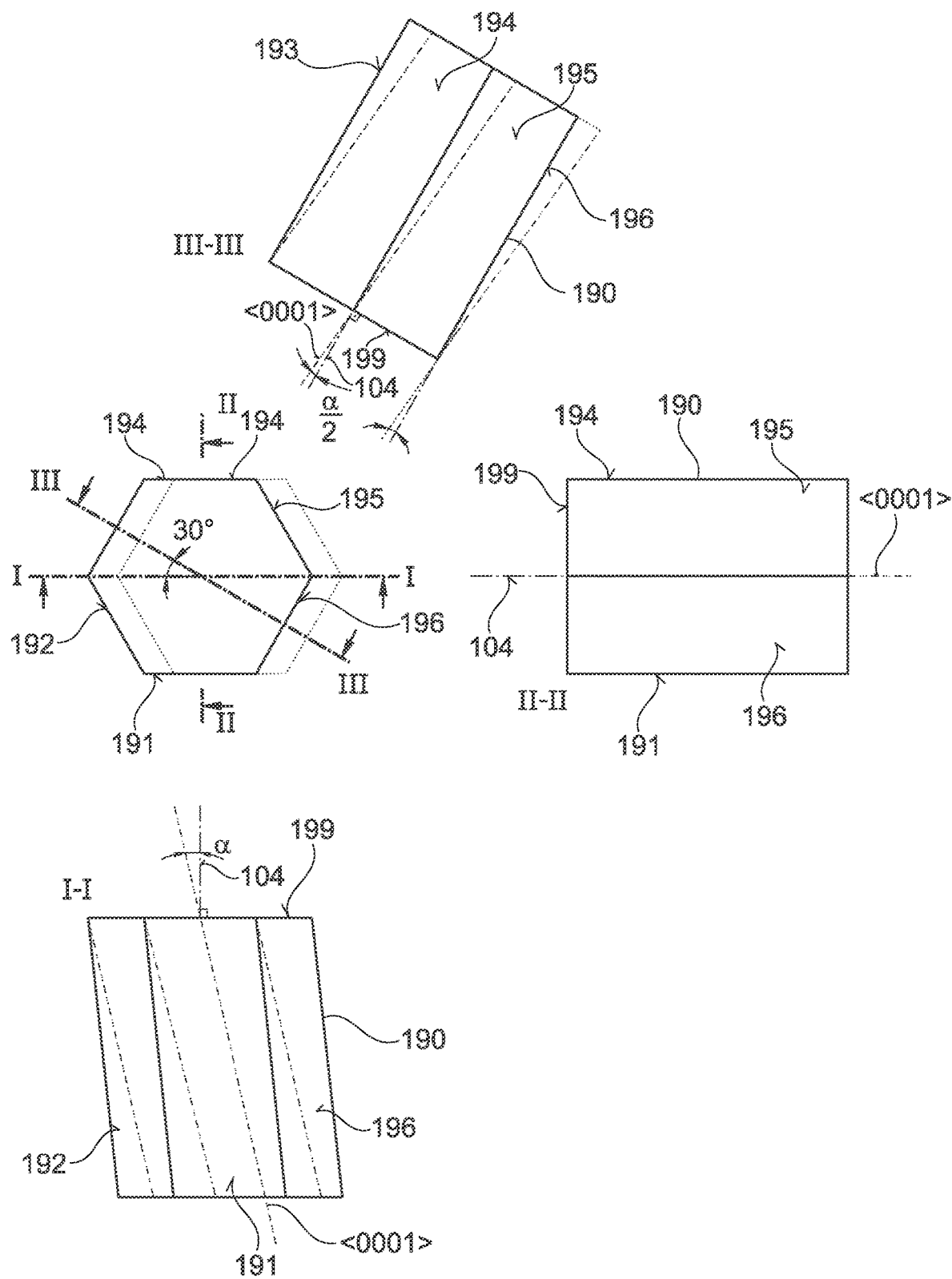

In FIGS. 2 and 3 a plane spanned by the c-axis (<0001> lattice direction) and the vertical direction 104 forms the bisecting plane of the angle between two neighboring different lattice planes 106 of the same family of lattice planes. The lattice planes 106 may belong to the {11-20} family of lattice planes or to the {1-100} family of lattice planes. The plane spanned by the vertical direction 104 and the c-axis may be parallel to the <11-20> direction or parallel to the <1-100> direction, by way of example.

In FIG. 2 each column sidewall 191, . . . , 196 is fully aligned to a lattice plane of the {11-20} family of lattice planes 106, wherein each column sidewall 191, . . . , 196 is aligned to another lattice plane of the {11-20} family of lattice planes 106. Column sidewalls 191, 194 extend in vertical planes. The four other column sidewalls 192, 193, 195, 196 are tilted to the vertical direction 104 by vertical tilt angles γ2, γ3, γ5, γ6 (γ2 and γ5 not shown) are equal to α/2 (half the off-axis angle α).

The columnar portion 190 of FIG. 2 may be formed by directed ion beam etching with the ion beam axis oriented parallel to the c-axis. Alternatively, the columnar portion 190 of FIG. 2 may be formed by directed ion beam etching with the ion beam axis oriented parallel to the vertical direction 104 and a heat treatment that promotes re-grouping of silicon and carbon atoms preferably along the main planes, e.g. the lattice planes of the {11-20} family of lattice planes 106.

In FIG. 3 all column sidewalls 191, . . . , 196 extend along vertical planes. Column sidewalls 191, 194 are aligned to two lattice planes 106 of the {11-20} family of lattice planes 106. The four other column sidewalls 192, 193, 195, 196 are vertically tilted to the respective lattice plane 106 by a vertical tilt angle γ2, γ3, γ5, γ6, (γ2 and γ5 not shown), which is α/2 (half the off-axis angle α).

The columnar portion 190 of FIG. 3 may be formed by directed ion beam etching with the ion beam axis oriented parallel to the vertical direction 104. For each of the four columns sidewalls 192, 193, 195, 196 a following heat treatment may result in a vertical tilt angle γ2, γ3, γ5, γ6 in a range from 0 degrees to α/2.

Figure 4:
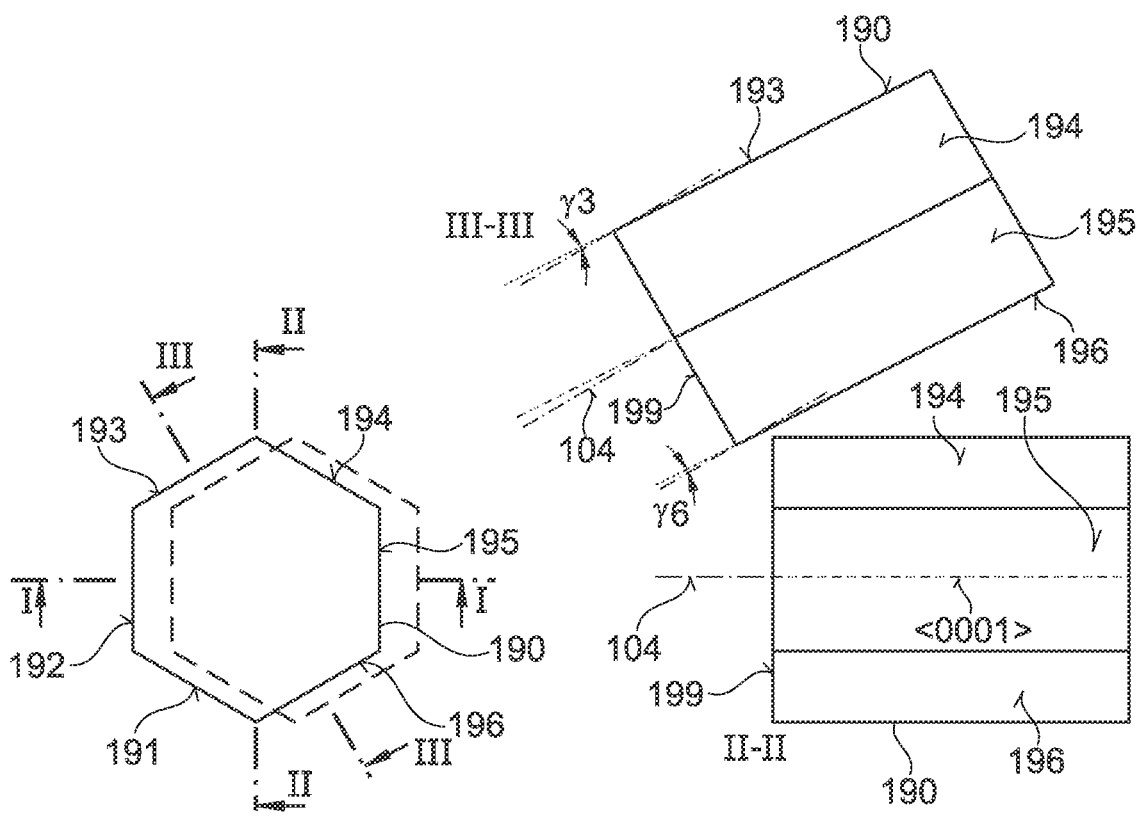
Figure 4:
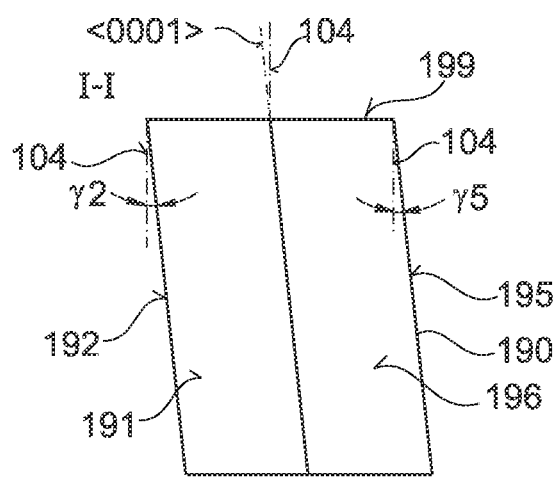
Figure 5:
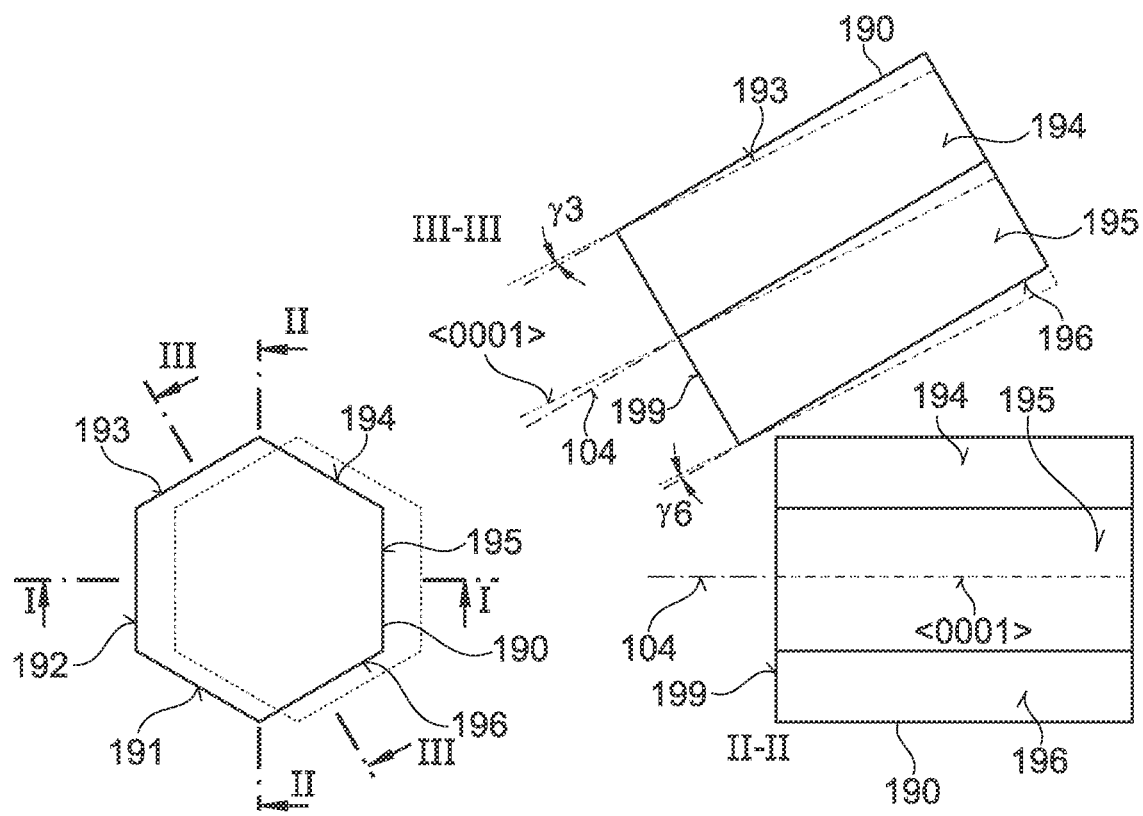
Figure 5:
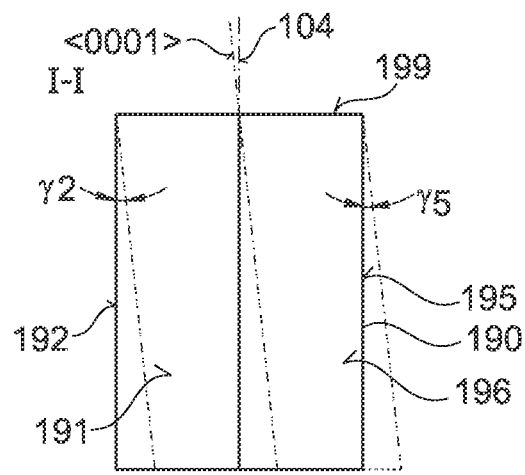

In FIGS. 4 and 5 a plane spanned by the c-axis (<0001> lattice direction) and the vertical direction 104 runs perpendicular to a lattice plane 106. The lattice plane 106 may belong to the {11-20} family of lattice planes or to the {1-100} family of lattice planes. The plane spanned by the vertical direction 104 and the c-axis may be parallel to the <11-20> direction or parallel to the <1-100> direction, by way of example In FIG. 4 each column sidewall 191, . . . , 196 is fully aligned to another lattice plane of the of the {11-20} family of lattice planes 106. Column sidewalls 192, 195 are vertically tilted to the vertical direction 104 by vertical tilt angles γ2, γ5 which are equal to the off-axis angle α. The four other column sidewalls 191, 193, 194, 196 are tilted to the vertical direction 104 by vertical tilt angles γ1, γ3, γ4, γ6 (γ1 and γ4 not shown), which are equal to α/2 (half the off-axis angle α).

The columnar portion 190 of FIG. 4 may be formed by directed ion beam etching with the ion beam axis oriented parallel to the c-axis. Alternatively, the columnar portion 190 of FIG. 4 may be formed by directed ion beam etching with the ion beam axis oriented parallel to the vertical direction 104 and a heat treatment that promotes re-grouping of silicon and carbon atoms preferably along main crystal planes.

In FIG. 5 all column sidewalls 191, . . . , 196 extend along vertical planes. Column sidewalls 192, 195 are vertically tilted to the respective lattice plane 106 by vertical tilt angles γ2, γ5 which are equal the off-axis angle α. The four other column sidewalls 191, 193, 194, 196 are tilted to the respective lattice plane by vertical tilt angles γ1, γ3, γ4, γ6 (γ1 and γ4 not shown), which are equal to α/2 (half the off-axis angle α).

The columnar portion 190 of FIG. 5 may be formed by directed ion beam etching with the ion beam axis oriented parallel to the vertical direction 104. For each of the two column sidewalls 192, 195 a following heat treatment may result in a vertical tilt angle γ2, γ5 in a range from 0 degrees to α. For each of the four column sidewalls 191, 193, 194, 196 a following heat treatment may result in a vertical tilt angle γ1, γ3, γ4, γ6 in a range from 0 degrees to α/2.

In the following FIGS. the columnar portions 190 are illustrated with vertical column sidewalls 191, . . . , 196 for simplicity. Actually, the columnar portions 190 may have vertical and/or tilted column sidewalls 191, . . . , 196 as described with reference to the preceding FIGS.

Figure 6:
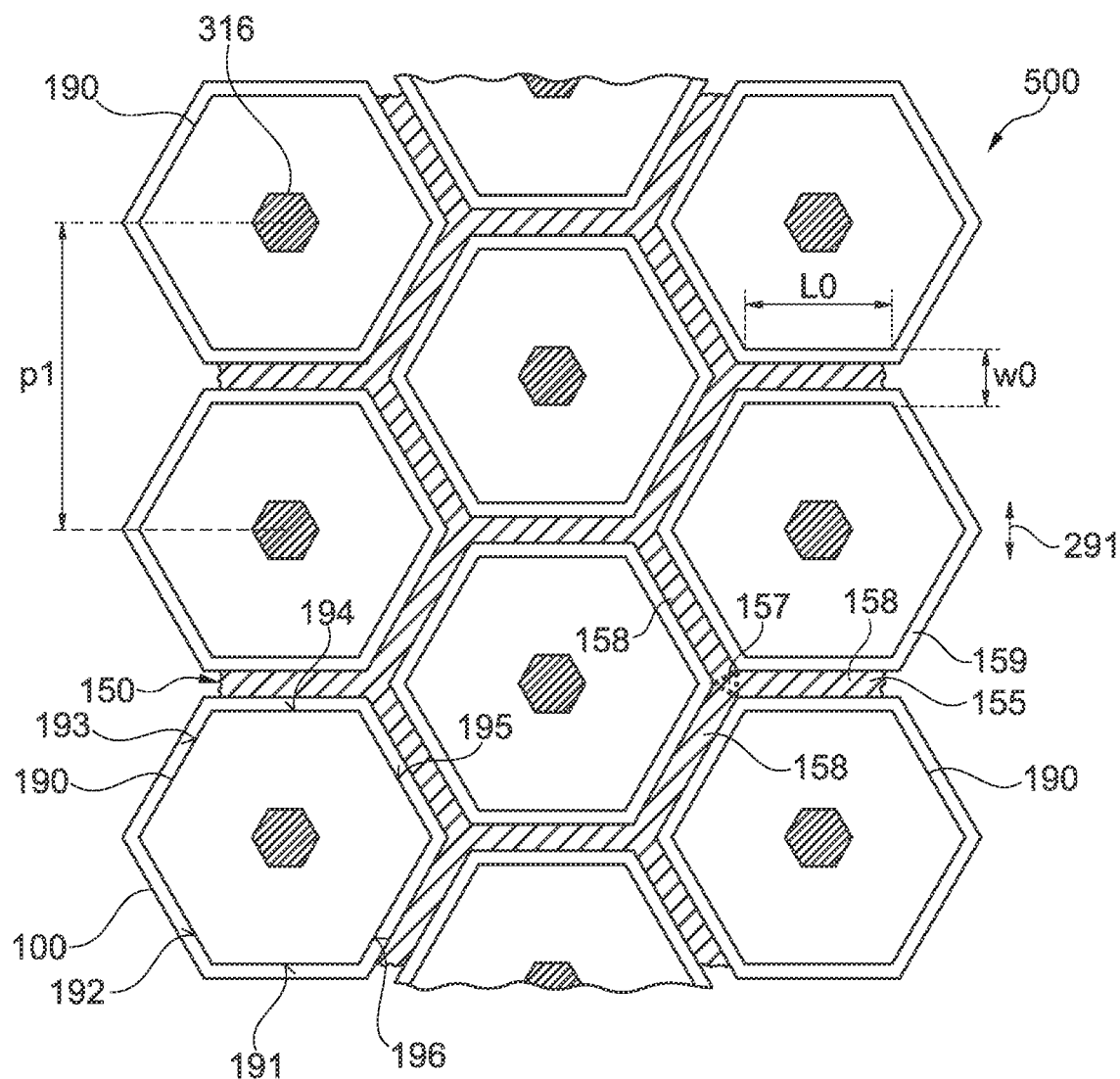
FIG. 6 shows a simplified plan view of a silicon carbide body with a grid-shaped gate structure according to a further embodiment of a silicon carbide device.

FIG. 6 shows a layout for a silicon carbide device 500 including a plurality of columnar portions 190. The columnar portions 190 may have the same horizontal cross-sectional shape and size. In the illustrated embodiment, the horizontal cross-sectional shape of the columnar portions 190 is a regular hexagon.

The columnar portions 190 may be arranged along lines extending along a lateral first direction 291. Within each line, the columnar portions 190 may be formed at equal center-to-center distances p1. The columnar portions 190 in neighboring lines may be shifted to each other along the first direction 291 by half the center-to-center distance p1.

A trench gate structure 150 laterally separates neighboring columnar portions 190 from each other. The gate structure 150 is in contact with the column sidewalls 191, . . . , 196. The gate structure 150 includes a plurality of line sections 158.

The line sections 158 may have the same lateral cross-sectional shape and size. The line sections 158 may have a width W0 in a range from 500 nm to 5 µm, e.g., from 1 µm to 4 µm. A length L0 of the line sections 158 may be in a range from 3*W0 to 20*W0. At the bottom, the gate structures 150 may be rounded. The line sections 158 may have the same vertical extension V0. The vertical extension V0 of the line sections 158 may be in a range from 0.3 µm to 5 µm, e.g., in a range from 0.5 µm to 2 µm.

Node sections 157 with triangular lateral cross-section connect three neighboring line sections 158. Six (6) line sections 158 form a complete frame around one columnar portion 190. The gate structure 150 forms a lateral grid with meshes. Each columnar portion 190 is formed in one mesh and each mesh includes one columnar portion 190.

The gate structure 150 includes a conductive gate electrode 155 and a gate dielectric 159. The gate dielectric 159 laterally separates the gate electrode 155 and the columnar portions 190. A groove contact structure 316 may be arranged in the center of each columnar portion 190.

Figure 7:
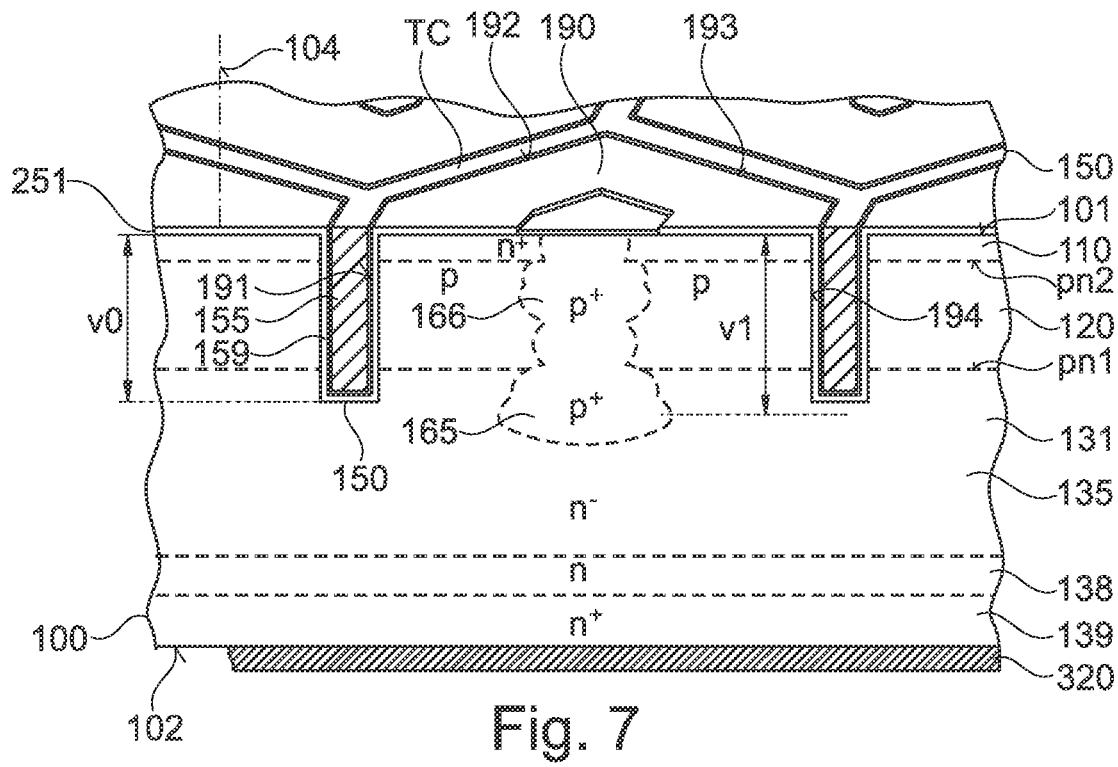
FIG. 7 shows a simplified vertical cross-sectional view of a portion of a silicon carbide device according to an embodiment with a shielding connection region.
Figure 8:
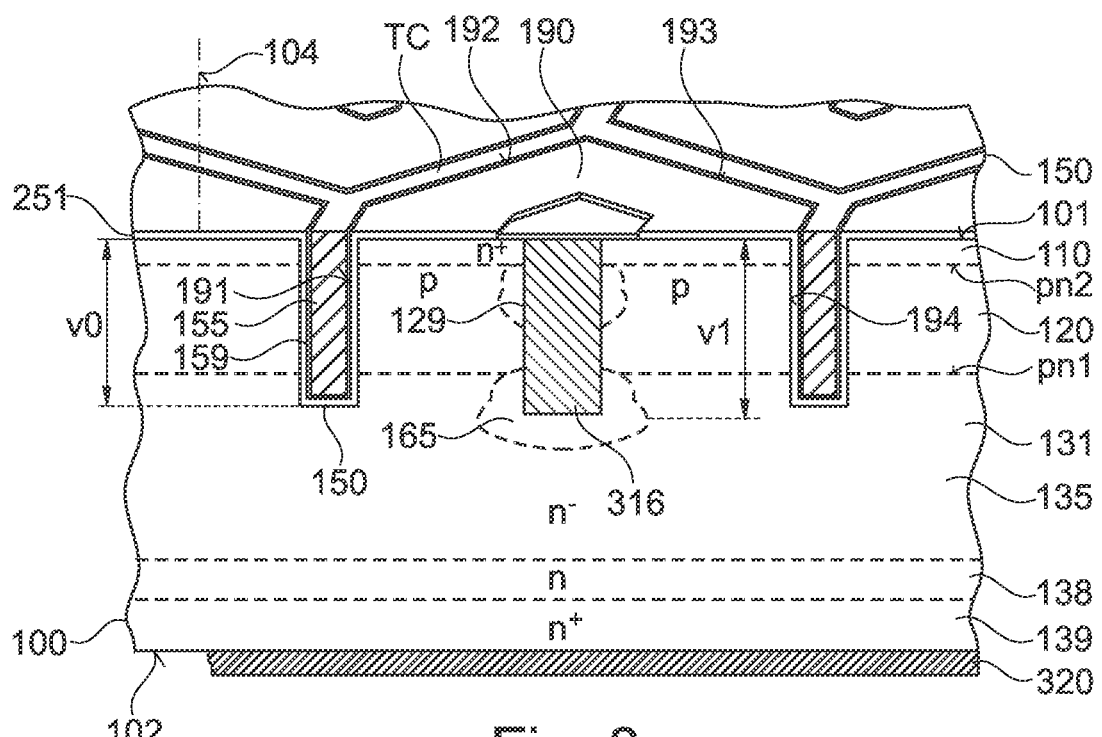
FIG. 8 shows a simplified vertical cross-sectional view of a portion of a silicon carbide device according to an embodiment with a groove contact structure.

FIGS. 7 and 8 refer to silicon carbide device 500 including transistor cells TC. Each silicon carbide devices 500 includes a silicon carbide body 100 with a first surface 101 at a front side and a second surface 102 at an opposite back side. The silicon carbide body 100 extends along a main extension plane in lateral directions. In a vertical direction 104 perpendicular to the lateral directions, the silicon carbide body 100 has a thickness, which is small compared to the extension of the silicon carbide body 100 along the main extension plane. The thickness of the silicon carbide body 100 between the first surface 101 and the second surface 102 is related to a nominal blocking capability of the manufactured silicon carbide device 500 and may be in the range of several hundred nm to several hundred µm. The c-axis (<0001> lattice direction) is tilted to the vertical direction 104 by an off-axis angle α.

The silicon carbide body 100 includes columnar portions 190. A gate structure 150 extends from a first surface 101 of the silicon carbide body 100 into the silicon carbide body 100. The columnar portions 190 and the gate structure 150 may be embodied as described above in connection with FIG. 1A to FIG. 6.

Each transistor cell TC includes one columnar portion 190 and a frame portion of the gate structure 150. The frame portion laterally surrounds the columnar portion 190. Each columnar portion 190 includes a source region 110 of a first conductivity type and a body region 120 of a second conductivity type.

The source region 110 is formed between the first surface 101 and the body region 120 and is in direct contact with the gate structure 150 along each column sidewall 191, . . . , 196. A horizontal cross-section of the source region 110 may form a ring between a central portion of the columnar portion 190 and the gate structure 150. The ring may have a hexagonal outer edge and a polygonal, circular or oval inner edge. A vertical extension of the source region 110 may be approximately uniform or may decrease with increasing distance to the gate structure 150.

The body region 120 separates the source region 110 and a drift structure 130, which is formed between the body region 120 and the second surface 102. The body region 120 is in direct contact with the gate structure 150 along each column sidewall. A horizontal cross-section of the body region 120 may be a ring between a central portion of the columnar portion 190 and the gate structure 150. The ring may have a hexagonal outer edge and a polygonal, circular or oval inner edge. A vertical extension of the body region 110 may be approximately uniform.

The body region 120 and the drift structure 130 form a first pn junction pn1. A distance between the first pn junction pn1 and the first surface 101 is smaller than a vertical extension V0 of the gate structure 150. The body region 120 and the source region 110 form a second pn junction pn2. A vertical extension of the body region 120 corresponds to a channel length of the transistor cells TC and may be in a range from 0.2 µm to 1.5 µm.

Between the transistor cells TC and the second surface 102 the silicon carbide body 100 includes a drift structure 130. The drift structure 130 may include a lightly doped drift zone 131 of the first conductivity type as voltage sustaining layer 135 and a heavily doped contact portion 139 between the drift zone 131 and the second surface 102. The heavily doped contact portion 139 may have the first conductivity type, the complementary second conductivity type or may include zones of both conductivity types, wherein zones of complementary conductivity type alternate along at least one lateral direction.

The heavily doped contact portion 139 may be or may include a substrate portion obtained from a crystalline ingot or may include a layer formed by epitaxy. Along the second surface 102, a dopant concentration in the contact portion 139 is sufficiently high to ensure a low-resistive ohmic contact between the contact portion 139 and a back side load electrode 320.

The drift zone 131 may be formed in a layer grown by epitaxy. A mean net dopant concentration in the drift zone 131 may be in the range from $10^{15}$ cm$^{-3}$ to $5*10^{16}$ cm$^{-3}$. The drift zone 131 may directly adjoin the contact portion 139. Alternatively, a buffer layer 138 forming a unipolar junction with the drift zone 131 may be located between the drift zone 131 and the contact portion 139. A vertical extension of the buffer layer 138 may be approximately 1 µm. A mean dopant concentration in the buffer layer 138 may be in a range from $3*10^{17}$ cm$^{-3}$ to $10^{18}$ cm$^{-3}$, by way of example.

The gate structure 150 includes a conductive gate electrode 155. The gate electrode 155 may include or consist of a heavily doped polycrystalline silicon layer and/or a metal-containing layer. The gate electrode 155 may be electrically connected to a gate metallization. The gate metallization forms or is electrically connected or coupled to a gate terminal.

A gate dielectric 159 is formed between the gate electrode 155 and the silicon carbide body 100. The gate dielectric 159 may include or consist of thermally grown or deposited silicon oxide, silicon nitride, silicon oxynitride, another deposited dielectric material or any combination thereof. A thickness of the gate dielectric 159 may be selected to obtain transistor cells TC with a threshold voltage in a range from 1.0 V to 8 V.

A deep shielding region 165 of the second conductivity type extends from a side oriented to the body region 120 into the drift zone 131. In the illustrated example, the deep shielding region 165 extends from the body region 120 into the direction of the second surface 102. The deep shielding region 165 is at a lateral distance to the gate structure 150. In other words: The deep shielding region 165 is laterally separated from the gate structure 150.

The deep shielding region 165 is formed at a distance to the first surface 101. The deep shielding region 165 has a local or global dopant concentration maximum at a distance V1 to the first surface 101. The distance V1 is greater than the vertical extension V0 of the gate structure 150. In other words, a portion of the deep shielding region 165 may extend deeper into the silicon carbide body 100 than the gate structure 150 such that a portion of the deep shielding region 165 is formed between the gate structure 165 and the second surface 102. Along the vertical direction 104, the deep shielding region 165 may include more than one local dopant concentration maximum. A maximum dopant concentration in the deep shielding region 165 may be higher than a maximum dopant concentration in the body region 120.

The deep shielding region 165 may be formed in and/or below a central section of the columnar portion 190. The central section of the columnar portion 190 includes a lateral center of the columnar portion 190 and the region directly around the lateral center. The deep shielding region 165 may be rotational symmetric, e.g. point-symmetric, with respect to a longitudinal axis of the deep shielding region 165. The longitudinal axis of the deep shielding region 165 connects the lateral centers of the columnar portion 190 at different distances to the first surface 101.

The source region 110 and the body region 120 are electrically connected to a front side load electrode. The deep shielding region 165 is electrically connected to the front side load electrode through a low-resistive ohmic path.

FIG. 7 shows a shielding connection region 166 of the second conductivity type. The shielding connection region 166 forms at least part of a low-resistive ohmic path between the front side load electrode and the deep shielding region 165. The shielding connection region 166 may extend from the first surface 101 to the deep shielding region 165. The shielding connection region 166 may be at a lateral distance to the gate structure 150. In other words, the shielding connection region 166 may be laterally separated from the gate structure 159.

The shielding connection region 166 may be formed in the central section of the columnar portion 190. The shielding connection region 166 may be rotational symmetric, e.g. point-symmetric. Along the vertical direction 104, the shielding connection region 166 may include more than one local dopant concentration maximum. A maximum dopant concentration in the shielding connection region 166 may be higher than a maximum dopant concentration in the body region 120.

FIG. 8 shows a groove contact structure 316. The groove contact structure 316 extends from the first surface 101 to or into the deep shielding region 165 and forms at least part of a low-resistive ohmic path between the front side load electrode and the deep shielding region 165. The groove contact structure 316 is at a lateral distance to the gate structure 150. The groove contact structure 316 is formed in the central section of the columnar portion 190. The groove contact structure 316 is rotational symmetric.

The illustrated embodiments refer to a silicon carbide device that includes n-channel transistor cells with n doped source regions 110 and with p doped body regions 120. Accordingly, the conductivity type of the source regions 110—or first conductivity type—is n-type and the conductivity type of the body regions 120—or second conductivity type—is p-type. The disclosure with regard to the n-channel transistor cells may apply, mutatis mutandis, to p-channel transistor cells by reversing the conductivity type of the first conductivity type and the second conductivity type.

Figure 9A:
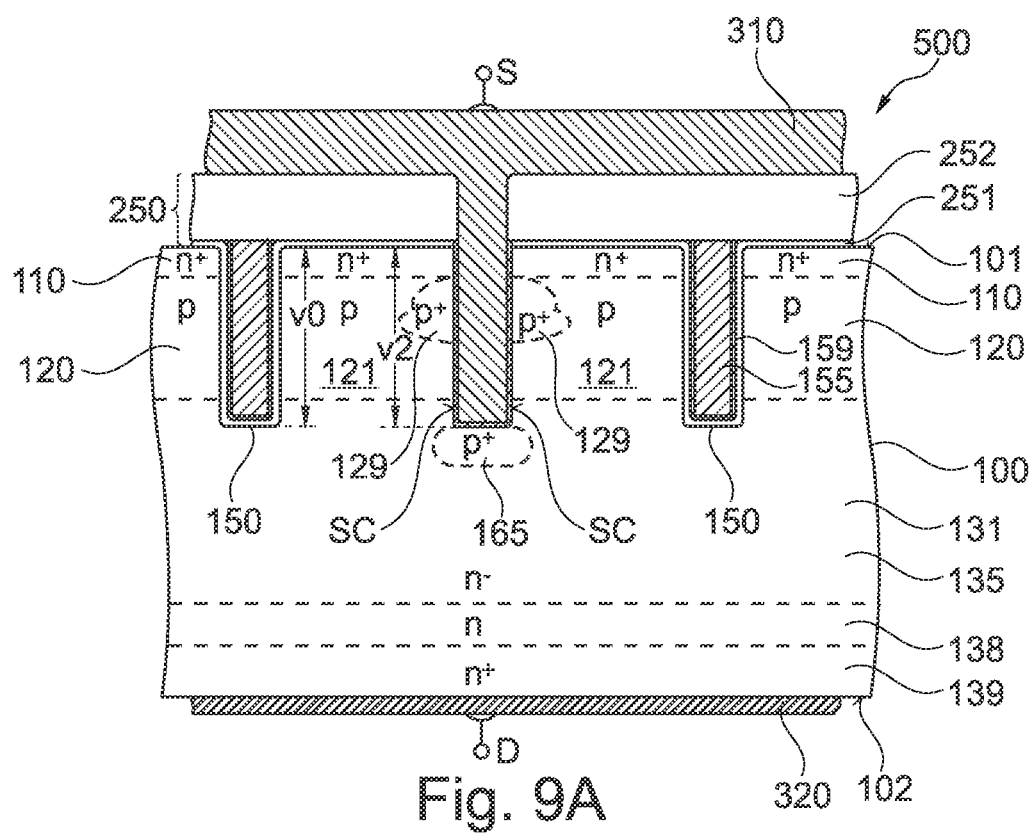
FIGS. 9A-9B show simplified vertical cross-sectional views of portions of silicon carbide devices according to embodiments with a Schottky contact formed along a groove contact structure.
Figure 9B:
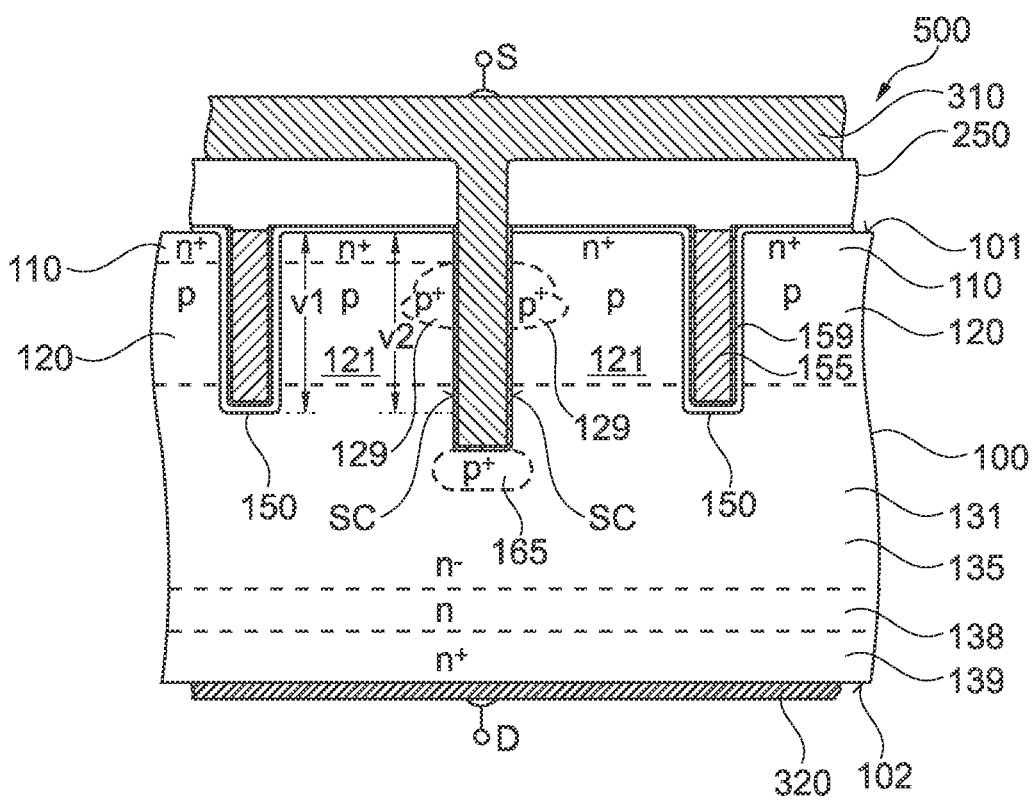

FIGS. 9A and 9B show a front side load electrode 310 at a front side of the silicon carbide body 100. The front side load electrode 310 is electrically connected with the source region 110 and the body region 120 of each transistor cell TC. The front side load electrode 310 may form or may be electrically connected with or coupled to a first load terminal, which may be an anode terminal of an MCD (MOS controlled diode) or a source terminal S of an MOSFET.

An interlayer dielectric 250 separates the front side load electrode 310 and the gate electrode 155 in the trench gate structures 150. The interlayer dielectric 250 may include one single layer or may include at least two sub-layers. A first sub-layer 251 may be formed together with the gate dielectric 159 and may have the same composition and thickness as the gate dielectric 159. A second sub-layer 252 may include deposited dielectric material, e.g., deposited silicon oxide.

A back side load electrode 320 forms a low-resistive ohmic contact with the contact portion 139. The back side load electrode 320 may form or may be electrically connected with or coupled to a second load terminal, which may be a cathode terminal of an MCD or a drain terminal D of an MOSFET.

The body region 120 of each transistor cell TC includes a heavily doped body contact region 129 and a more lightly body channel region 121. The body channel region 121 separates the body contact region 129 from the gate structure 150.

A groove contact structure 316 extends from the front side load electrode 310 through an opening in the interlayer dielectric 250 into the silicon carbide body 100. The groove contact structure 316 and the source region 110 form a lateral low-resistive ohmic contact. The groove contact structure 316 and the body region 120 form a lateral low-resistive ohmic contact. The groove contact structure 316 and the deep shielding region 165 form a low-resistive ohmic contact. The groove contact structure 316 and the drift zone 131 form a Schottky contact SC. The Schottky contact SC is located between the body region 120 and the deep shielding region 165. The Schottky contact SC may completely surround the groove contact structure 316.

In FIG. 9A a vertical extension V2 of the groove contact structure 165 is approximately the same as the vertical extension V0 of the gate structure 150.

In FIG. 9B a vertical extension V2 of the groove contact structure 165 is significantly greater than the vertical extension V0 of the gate structure 150. A contact area of the Schottky contact SC is comparatively large.

Figure 10:
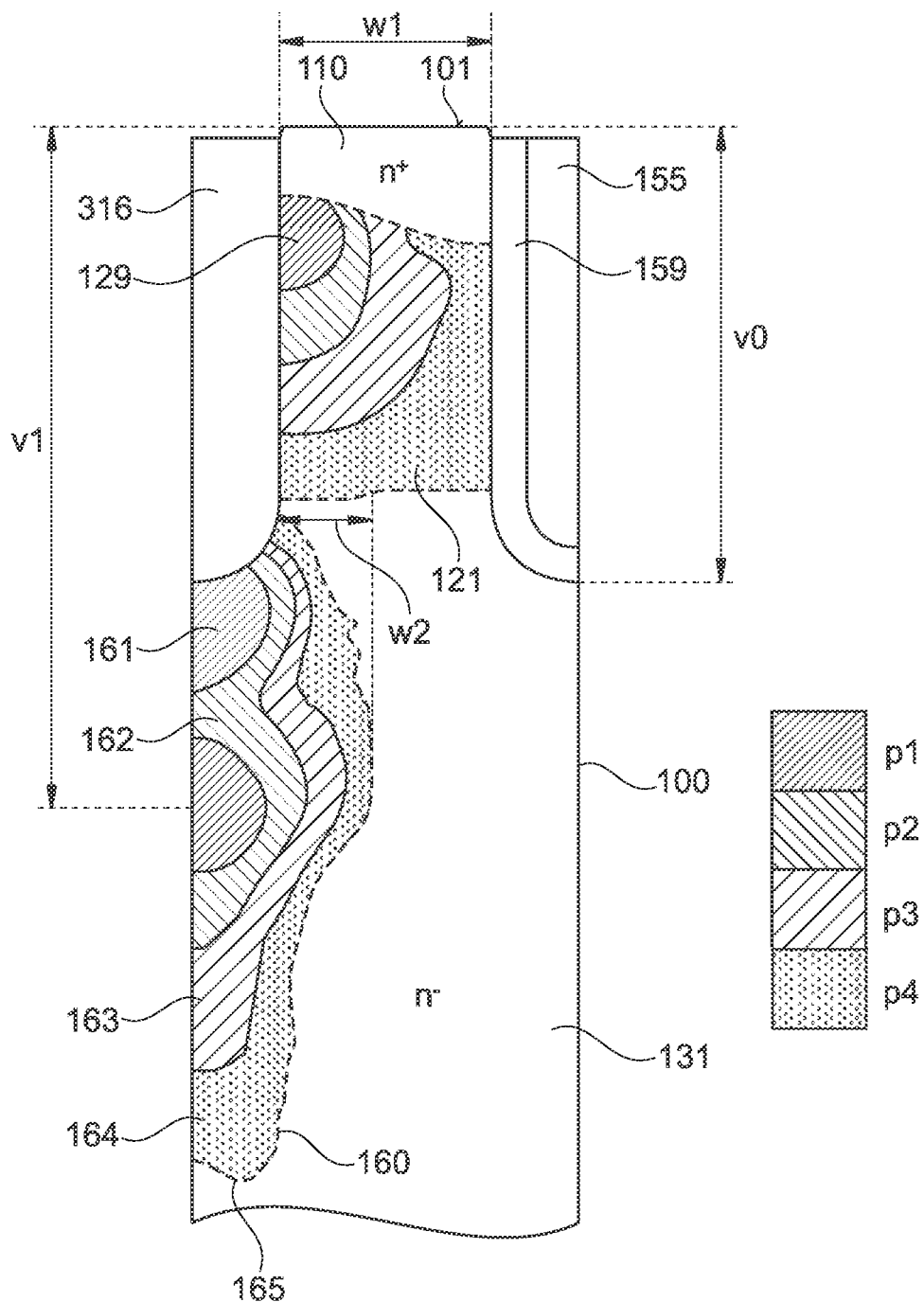
FIG. 10 is a schematic illustration of a dopant distribution in a deep shielding region in a cross section through a section of a silicon carbide device in accordance with an embodiment.

FIG. 10 schematically shows the dopant distribution of a deep shielding region 165 that results, for example, from ion implantation through a trench temporarily formed for the formation of a groove contact structure 316. The ion implantation may include at least two partial implantations at different acceleration energies.

The deep shielding region 165 includes a first partial region 161 having a net dopant concentration p1 that is higher than a net dopant concentration p2 in a second partial region 162, which for its part is higher than a net dopant concentration p3 in a third partial region 163, which is in turn higher than a net dopant concentration p4 in a fourth partial region 164. A distance V1 between a deepest local dopant maximum in the deep shielding region 165 and the first surface 101 is significantly greater than the vertical extension V0 of the gate structures 150. By way of example, V1 is at least 150% of V0. A lateral extension W2 of the deep shielding region 165 beyond the sidewall of the groove contact structure 316 is at most 60% of a smallest distance W1 between the groove contact structure 316 and the gate structure 150.

FIGS. 11A-11D relate to the formation of a deep shielding region 165 by implantation through the bottom of contact trenches before the filling thereof with a conductive material.

Figure 11A:
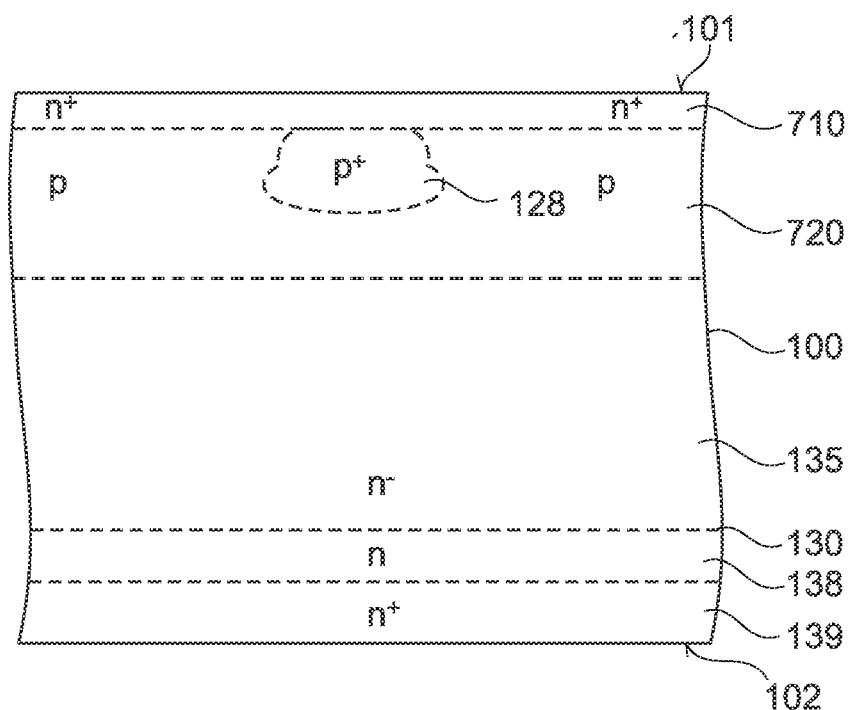
FIGS. 11A-11D are schematic vertical cross-sectional views of a portion of a silicon carbide device for illustrating a method of manufacturing a silicon carbide device according to an embodiment.

FIG. 11A shows a silicon carbide body 100 with a drift structure 130 that includes a contact portion 139, a buffer layer 138 and a drift zone 131 as described above. A source layer 710 is formed along the first surface 101. A body layer 720 is formed between the source layer 710 and the drift structure 130. A masked ion implantation forms a heavily doped region 128 in the body layer 120.

A trench etching mask 420 having a groove mask opening 425 and a grid mask opening 426 is formed on the first surface 101 by means of a photoresist mask 422.

Figure 11B:
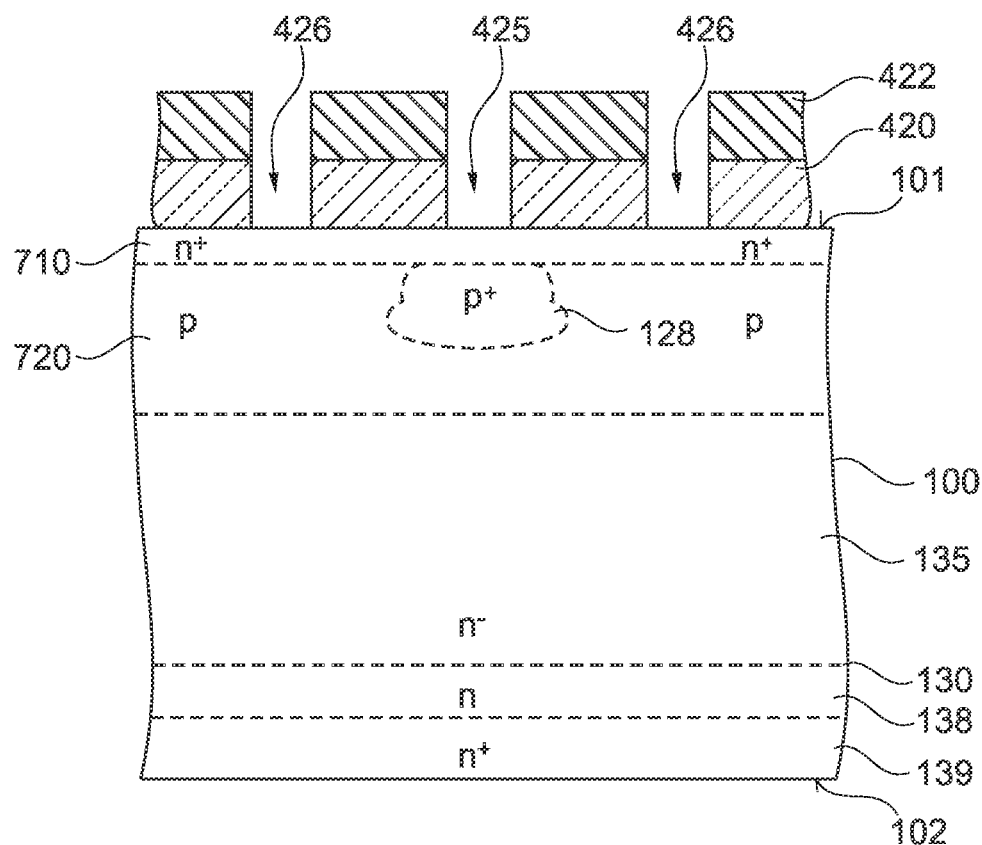

As shown in FIG. 11B, the groove mask opening 425 is formed in the vertical projection of the doped region 128 and the grid mask opening 426 is at a lateral distance to the groove mask opening 425. The pattern of the trench etching mask 420 is transferred into the silicon carbide body 100, wherein a contact trench 715 and a gate trench 750 are formed in the silicon carbide body 100. Edges at the bottom and at the opening of the contact trenches 715 and of the gate trenches 750 can be rounded, for example by means of a heat treatment in an atmosphere in which silicon carbide neither oxidizes nor forms a nitride layer and in which the heat treatment regroups the atoms of the silicon carbide crystal in a suitable manner. The heat treatment may also be used to align sidewalls of the groove mask opening 425 to, e.g., a-planes.

Exposed sections of the silicon carbide body 100 in the contact trenches 715 and in the gate trenches 750 can be oxidized by means of a heat treatment in an oxygen-rich atmosphere.

A further mask layer is deposited and patterned by photolithography. Dopants of the conductivity type of the body layer 720 are introduced into the silicon carbide substrate 700 through the bottom of the contact trench 715, for example by means of an implantation process comprising implantations of at least two different energy levels.

Figure 11C:
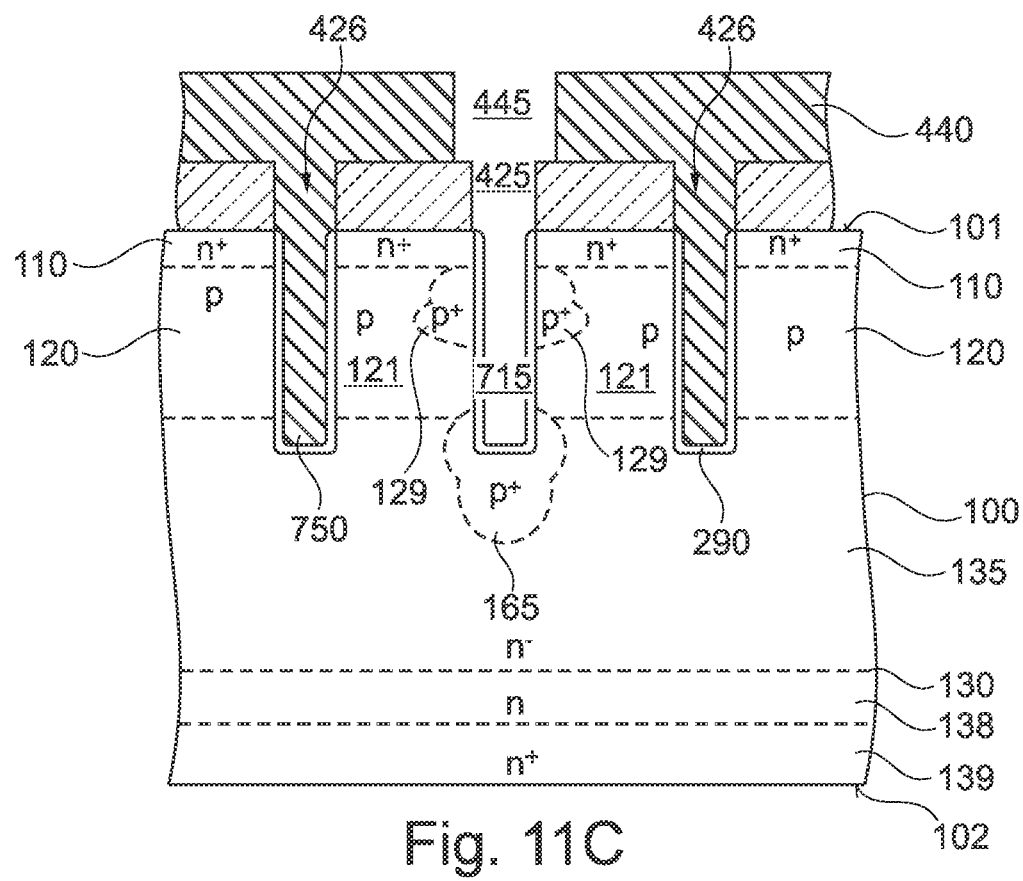

FIG. 11C shows the contact trench 715 extending from the first surface 101 down the drift structure 130. A residual section of the source layer 710 forms a source region 110. A residual section of the body layer 720 forms a body region 120. A residual section of the doped region 128 of FIG. 11B forms a body contact region 129 surrounding the contact trench 715. A sacrificial oxide layer 290 produced by the heat treatment covers the inner surfaces of the contact trench 715 and of the gate trench 750 with approximately uniform layer thickness. A mask opening 445 of an implantation mask 440 that resulted from the further mask layer exposes the groove mask opening 425 of the trench etching mask 420 and fills or covers the grid mask opening 426. Below the contact trench 715, the dopants introduced through the trench bottom form a deep shielding region 165 that is spaced apart from the gate trench 750 and that extends into the silicon carbide body 100 more deeply than the gate trench 750.

The implantation mask 440, the trench etching mask 420 and the sacrificial oxide layer 290 are removed, wherein crystal defects near the surface are also removed by the formation and removal of the sacrificial oxide layer 290. A gate dielectric layer 156 is formed.

Figure 11D:
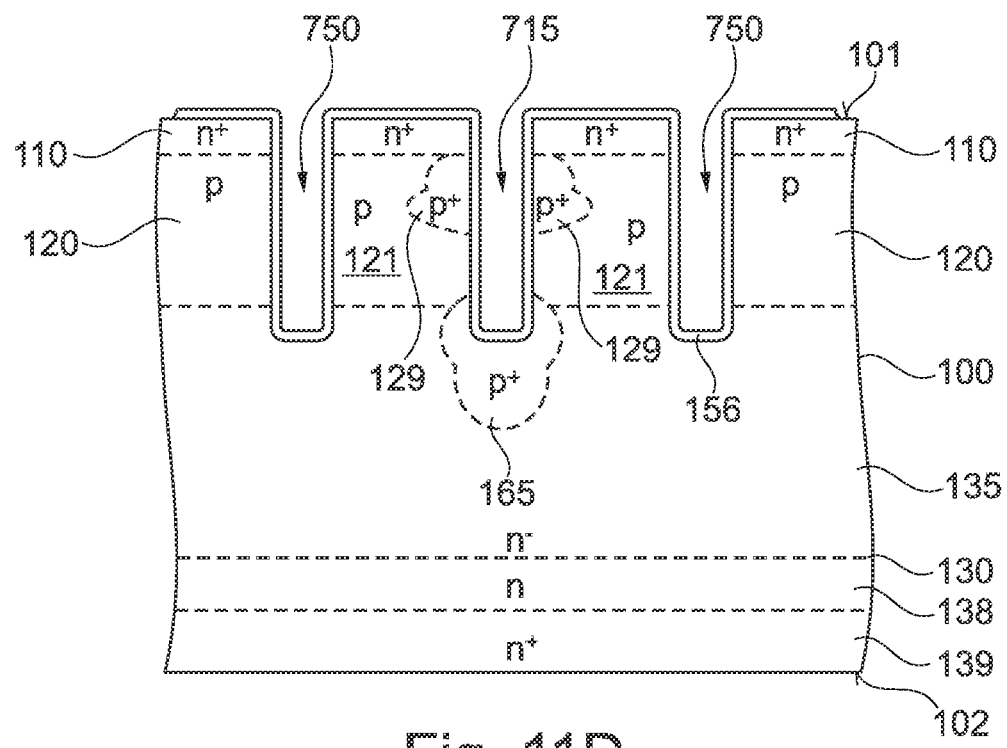

FIG. 11D shows the gate dielectric layer 156 covering the silicon carbide substrate 700 on the front side with uniform layer thickness. The gate dielectric layer 156 may be selectively removed from the contact trench 715. Further processes may result in silicon carbide devices 500 as described with reference to FIGS. 8, 9A and 9B, by way of example.

For illustration, various scenarios have been described with respect to a silicon carbide device. Similar techniques may be implemented in semiconductor devices based on other kinds and types of compound semiconductors material for the silicon carbide body, e.g., gallium nitride (GaN) or gallium arsenide (GaAs), etc.

Also for illustration, various techniques have been described with respect to columnar portions with regular hexagonal lateral cross-section. Similar techniques may be implemented in other kinds and types of columnar portions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A silicon carbide device, comprising:
a silicon carbide body having a hexagonal crystal lattice with a c-plane and further main planes, wherein the further main planes comprise a-planes and m-planes, wherein a lateral mean surface plane of the silicon carbide body is tilted to the c-plane by an off-axis angle, wherein the silicon carbide body comprises a columnar portion with column sidewalls, wherein at least three of the column sidewalls are oriented along a respective one of the further main planes; and
a trench gate structure in contact with the at least three of the column sidewalls.

2. The silicon carbide device of claim 1,
wherein for each of the at least three of the column sidewalls, the c-plane and the column sidewall form a respective first intersection line and the c-plane and the further main plane that is oriented to the column sidewall form a respective second intersection line, and
wherein an absolute value of an in-plane tilt angle between the first intersection line and the second intersection line is in a range from 0 degrees to 2 degrees.

3. The silicon carbide device of claim 1, wherein for each of the at least three of the column sidewalls, an absolute value of a vertical tilt angle between the column sidewall and the further main plane that is oriented to the column sidewall is in a range from 0 degrees to the degree of the off-axis angle.

4. The silicon carbide device of claim 3, wherein the absolute values of the vertical tilt angles are in a range from 0 degrees to half of the degree of the off-axis angle.

5. The silicon carbide device of claim 1, wherein the at least three column sidewalls neighbor each other.

6. The silicon carbide device of claim 1,
wherein at least four of the column sidewalls are oriented along a respective one of the further main planes, and
wherein the gate structure is in contact with the at least four of the column sidewalls.

7. The silicon carbide device of claim 1, wherein a cross-section of the columnar portion in the c-plane forms a hexagon.

8. The silicon carbide device of claim 1, wherein the gate structure forms a grid laterally separating neighboring columnar portions.

9. The silicon carbide device of claim 1,
wherein the columnar portion comprises a source region of a first conductivity type and a body region of a second conductivity type,
wherein the source region is formed between a first surface of the silicon carbide body and the body region, and
wherein the source region is in contact with the at least three of the column sidewalls.

10. The silicon carbide device of claim 9,
wherein the silicon carbide body further comprises a voltage sustaining layer, and
wherein the columnar portion is formed between the first surface and the voltage sustaining layer.

11. The silicon carbide device of claim 10, further comprising:
a deep shielding region of the second conductivity type and extending from a side oriented to the body region into the voltage sustaining layer,
wherein the deep shielding region is at a lateral distance to the gate structure, and
wherein a distance between the first surface and a local dopant maximum in the deep shielding region is greater than a vertical extension of the gate structure.

12. The silicon carbide device of claim 10, further comprising:
a shielding connection region of the second conductivity type and extending from the first surface to the deep shielding region, and
wherein the shielding connection region is at a lateral distance to the gate structure.

13. The silicon carbide device of claim 10, further comprising:
a groove contact structure extending from the first surface to or into the deep shielding region.

14. The silicon carbide device of claim 13,
wherein the body region comprises a heavily doped body contact region, and
wherein the body contact region is in contact with the groove contact structure.

15. The silicon carbide device of claim 13,
wherein the voltage sustaining layer and the groove contact structure form a Schottky contact, and
wherein the Schottky contact is located between the body region and the deep shielding region.

16. A method of manufacturing a silicon carbide device, the method comprising:
providing a silicon carbide body having a hexagonal crystal lattice with a c-plane and further main planes, wherein the further main planes comprise a-planes and m-planes, wherein a mean surface plane of the silicon carbide body is tilted to the c-plane by an off-axis angle;
forming a trench extending from a first surface into the silicon carbide body, wherein the trench laterally exposes column sidewalls of a columnar portion of the silicon carbide body, and wherein at least three of the column sidewalls are oriented along the further main planes; and
forming a trench gate structure in the trench, wherein the gate structure is in contact with the at least three of the column sidewalls.

17. The method of claim 16, wherein forming the trench comprises a directed etch process with an axis of an etch beam oriented parallel to the <0001> lattice direction.

18. The method of claim 16, wherein forming the trench comprises a directed etch process with an axis of an etch beam oriented vertical to the first surface and, after etching, a heat treatment in an atmosphere containing hydrogen gas.

* * * * *